United States Patent [19]

Miyashita

[11] Patent Number: 6,051,993

[45] Date of Patent: Apr. 18, 2000

[54] LEVEL SHIFT CIRCUIT COMPENSATING FOR CIRCUIT ELEMENT CHARACTERISTIC VARIATIONS

[75] Inventor: Miyo Miyashita, Itami, Japan

[73] Assignee: Mitsubishi Denki Kabushiki Kaisha, Tokyo, Japan

[21] Appl. No.: 08/094,220

[22] Filed: Jul. 21, 1993

[30] Foreign Application Priority Data

Feb. 19, 1993 [JP] Japan .................................. 5-029979

[51] Int. Cl.[7] ........................................... H03K 19/0175
[52] U.S. Cl. ............................................. 326/80; 326/117
[58] Field of Search .................................. 307/448, 450, 307/475, 443, 296.8; 326/116, 117, 80

[56] References Cited

U.S. PATENT DOCUMENTS

| | | |
|---|---|---|
| 4,068,140 | 1/1978 | Lou . |
| 4,584,492 | 4/1986 | Sharp ........................................ 307/443 |
| 4,645,998 | 2/1987 | Shinohara et al. .................... 307/296.8 |
| 4,697,110 | 9/1987 | Masuda et al. ........................... 307/450 |
| 4,717,836 | 1/1988 | Doyle ....................................... 307/475 |
| 4,926,071 | 5/1990 | MacMillan et al. ..................... 307/448 |
| 4,968,904 | 11/1990 | Yamashita et al. ...................... 307/448 |
| 5,177,378 | 1/1993 | Nagasawa ................................ 307/448 |
| 5,225,718 | 7/1993 | Seshita et al. ........................... 307/448 |

FOREIGN PATENT DOCUMENTS

| | | |
|---|---|---|
| 349272 | 6/1989 | European Pat. Off. . |
| 57-176837 | 10/1982 | Japan . |
| 58-092140 | 6/1983 | Japan . |
| 58-92140 | 6/1983 | Japan . |
| 62-262514 | 11/1987 | Japan . |
| 63-268303 | 11/1988 | Japan . |
| 63-311805 | 12/1988 | Japan . |
| 1305722 | 12/1989 | Japan . |
| 2149014 | 6/1990 | Japan . |
| 2256318 | 10/1990 | Japan . |
| 2166312 | 4/1986 | United Kingdom . |

Primary Examiner—Michael J. Tokar
Assistant Examiner—Richard Roseen
Attorney, Agent, or Firm—Leydig, Voit & Mayer, Ltd.

[57] ABSTRACT

A level shift circuit which drops the output voltage of a prior stage circuit to an input voltage level required at a next stage circuit includes a source follower enhancement-type FET, a gate of which is connected as an input terminal, a drain of which is connected to a positive power supply, and a source of which is connected to an anode of a level shift diode; a current adjusting enhancement-type FET, a drain of which is connected to a cathode of the level shift diode, a drain and a gate of which are connected to each other through a constant current source, and a source of which is connected to a negative power supply, an out-put terminal being taken from the connection node of the level shift diode and the constant current source; and a resistor connected between the constant current source and the negative power supply, the current adjusting enhancement-type FET having its gate-to-source voltage controlled by the current flowing through the resistor, thereby adjusting the current flowing through the source follower enhancement-type field effect transistor.

1 Claim, 4 Drawing Sheets

LEVEL SHIFT CIRCUIT COMPENSATING FOR CIRCUIT ELEMENT CHARACTERISTIC VARIATIONS

FIELD OF THE INVENTION

The present invention relates to a level shift circuit which drops the output voltage of a prior stage circuit to an input voltage level of the next stage circuit, and more particularly, to a level shift circuit which suppresses the variation in the amount of level shift caused by the variations in device characteristics of a source follower enhancement type field effect transistor (hereinafter referred to as FET).

BACKGROUND OF THE INVENTION

FIG. 5 is a diagram showing a circuit construction of a prior art level shift circuit. In FIG. 5, reference numeral 500 designates a level shift circuit. A drain of a source follower enhancement type FET 1(Q1) is connected to a positive power supply 30, and a gate thereof is connected to an input terminal 10 to which an output signal of the prior stage circuit is input, and a source thereof is connected to the anode of the level shift diode 2. A constant current source 3 is connected between the cathode of the level shift diode 2 and the negative power supply 40 and an output terminal 20 is taken from the connection node of the cathode of the level shift diode 2 and the constant current source 3, thus constituting a level shift circuit.

Here, while in the above example the level shift diode 2 comprises two diodes D1 and D2 connected in series to each other, the number of diodes is not restricted thereto and can be determined in accordance with the voltage to be dropped. In addition, the constant current source 3 is constituted by a depletion FET having its gate and its source connected with each other.

A description is given of an operation hereinafter.

When it is supposed that a current which is made to flow through the level shift circuit 500 by the constant current source 3 is $I_{const}$ and that the source follower enhancement type FET 1 is operated in the saturation region, the level shift amount $V_{gs}$ between its gate and its source, is represented by the following formula (1).

$$V_{gs} = \sqrt{\frac{I_{const}}{K}} + V_{th} \quad (1)$$

here, K: gain coefficient of the enhancement type FET 1(Q1)

$V_{th}$: threshold voltage of the enhancement type FET 1(Q1)

From equation (1), by setting the current $I_{const}$ flowing through the constant current source 3 to an appropriate value, the level shift amount $V_{gs}$ at the source follower enhancement type FET 1(Q1) is determined. The reason why the enhancement type FET 1(Q1) is employed for the source follower FET is because the enhancement type FET can produce a desired level shift with less current $I_{const}$ than a depletion type FET, thereby resulting in a low power dissipation. Here, when the voltage difference between the gate and the source in the source follower enhancement type FET 1(Q1) is larger than its junction voltage $\phi_B$ (about 0.7 V), a forward direction current flows between the gate and source of the FET, and the level shift amount $V_{gs}$ falls within 0 to 0.7 V and does not exceed that range.

In this level shift circuit, in order to increase the level shift of the entire circuit $V_{shift}$ to a value larger than the junction voltage $\phi_B$ (about 0.7 V), the level shift diode 2 is employed. The level shift amount at one level shift diode D1, D2 is approximately equal to its junction voltage difference $\phi_B$ (about 0.7 V) and the level shift amount of the entire circuit $V_{shift}$ is represented by the following formula (2) providing an appropriate number of level shift diodes enables setting of a level shift amount at any arbitrary value larger than 0.7 V.

$$V_{shift} = \sqrt{\frac{I_{const}}{K}} + V_{th} + \phi_B \times (\text{the number of diodes}) \quad (2)$$

In the prior art level shift circuit constituted as described above, if the device parameters of the source follower enhancement type FET 1(Q1) such as threshold voltages and gain coefficients deviate from predetermined set values, the variations in the device parameters vary the level shift amount $V_{gs}$ a function of the current $I_{const}$ of the source follower enhancement type FET 1(Q1), thereby resulting in variations in the output voltage of the entire circuit of the level shift circuit, that is, the amount of the level shift.

Here, variations in the threshold value of enhancement type FETs are about several tens of mV for FETs made on the same wafer, and reach about 100 mV for FETs made on different wafers.

SUMMARY OF THE INVENTION

It is an object of the present invention to provide a level shift circuit that provides a desired constant output voltage even when device parameters, such as threshold voltage and gain coefficient of a source follower enhancement type FET deviate from the design values.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to the those skilled in the art from this detailed description.

According to a first aspect of the present invention, a level shift circuit which drops the output voltage of the prior stage circuit to an input voltage level required at the next stage circuit, includes a source follower enhancement type field effect transistor a gate of which is connected to an input terminal, a drain of which is connected to a positive power supply, and a source of which is connected to an anode of a level shift diode, a current adjusting enhancement type field effect transistor a drain of which is connected to a cathode of the level shift diode, a drain and a gate of which are connected with each other via a constant current source, and a source of which is connected to a negative power supply, an output terminal which is taken out from the connection node of the level shift diode and the constant current source, and a resistor connected between the constant current source and the negative power supply. The current adjusting enhancement type field effect transistor has its gate-to-source voltage set by a current flowing through the resistor, thereby adjusting the current flowing through the level shift diode.

In this construction, since the current adjusting enhancement type FET is connected in parallel to the constant current source, even when the threshold value or the gain coefficient of a source follower enhancement type FET varies between wafers because of wafer processes, similar variations also arise in the current adjusting enhancement type FET produced on the wafer in the vicinity of the source follower enhancement type FET, thereby adjusting the current flowing through the source follower enhancement type FET.

According to a second aspect of the present invention, a level shift circuit of the above construction further includes a capacitance connected in parallel with the level shift diode.

In this construction, since a capacitance is connected in parallel with a level shift diode, a high frequency signal input to the input terminal is output to the output terminal through this capacitance, so that deterioration in the waveform due to the input capacitance of the source follower FET and the internal resistance of the level shift diode is prevented.

According to a third aspect of the present invention, a level shift circuit of the above-described construction further includes a direct connection of the source of the source follower FET and the drain of the current adjusting FET removing the level shift diode.

Because the level shift diode is removed, the level shift amount comprises only the gate-to-source voltage of the source follower FET and a buffer circuit having a level shift function having a level shift less than 0.7 V.

According to a fourth aspect of the present invention, a level shift circuit of the above-described construction includes a constant current source connected between a positive power supply and a gate of a current adjusting FET, not between the drain and the gate of the current adjusting FET.

In this construction, since the current of the constant current source biases a current adjusting enhancement type FET and a current of the entire level shift circuit determined by the drain current of a current adjusting FET, the same function as described above is obtained and the size of the resistor inserted between the gate and the source of the current adjusting FET can be arbitrarily set.

DETAILED DESCRIPTION OF THE EMBODIMENT

EMBODIMENT 1

Figure 1:
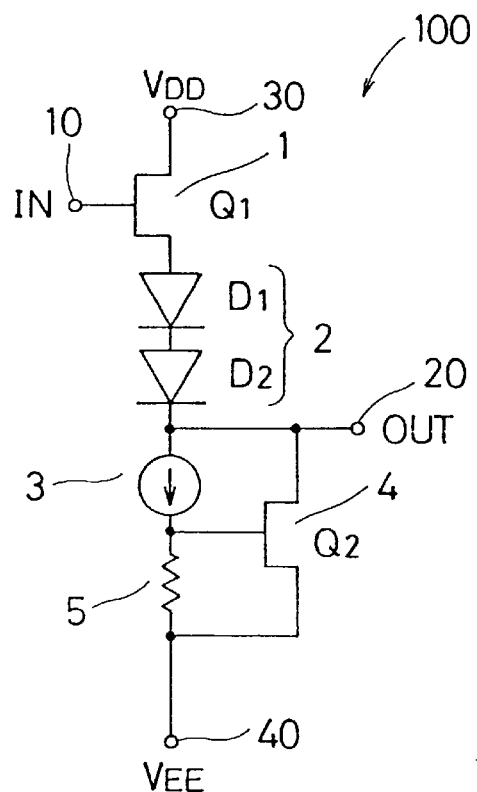
FIG. 1 is a diagram illustrating a circuit construction of a level shift circuit according to a first embodiment of the present invention.
Figure 5:
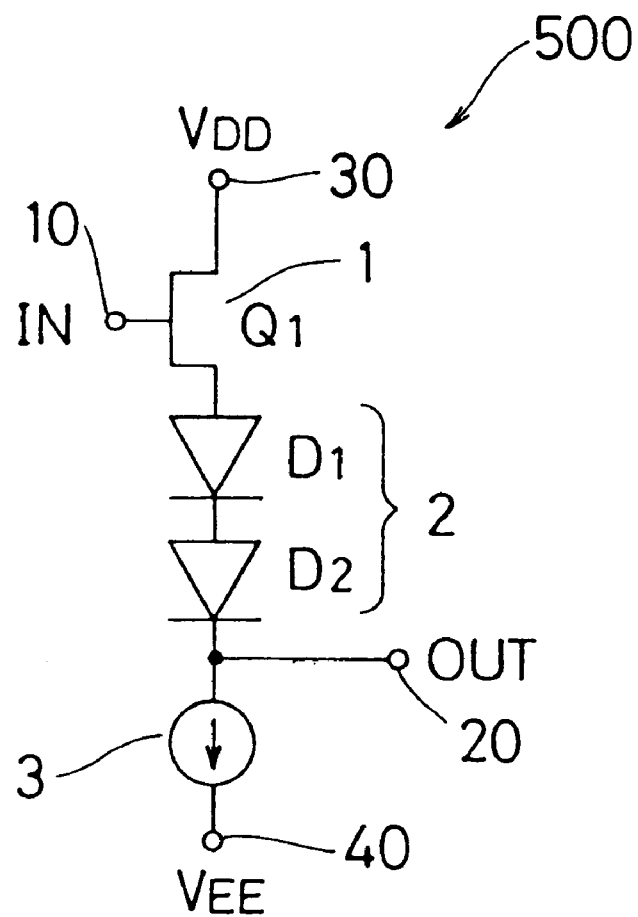
FIG. 5 is a diagram illustrating a circuit construction of a level shift circuit according to the prior art.

FIG. 1 is a diagram illustrating a level shift circuit according to a first embodiment of the present invention. In FIG. 1, reference numerals shown in FIG. 5 designates the same or corresponding elements. Reference numeral 100 designates a level shift circuit of this first embodiment. In this level shift circuit 100, a drain of a current adjusting enhancement type FET 4(Q2) is connected to an output terminal 20 of the level shift circuit 500 shown in FIG. 5 and a source of the current adjusting enhancement type FET 4(Q2) is connected to a negative power supply 40. A gate of the current adjusting FET 4(Q2) is connected to the other end of a constant current source 3 and a bias resistor 5 is inserted between the gate and the source of the current adjusting enhancement type FET 4(Q2). In this circuit, the gate-to-source voltage of the current adjusting FET 4(Q2) is determined by the current from the constant current source 3 that flows through the resistor 5.

A description is given of the operation.

In this level shift circuit, the current flowing through the circuit is a sum of a current $I_{const}$ determined by the constant current source 3 and a current $I_{var}$ flowing through the current adjusting enhancement type FET 4(Q2). Accordingly, suppose that the design value of the threshold voltage of the enhancement type FET is $V_{th}$, the level shift amount $V_{gs1}$ between the gate and source of the source follower enhancement type FET 1(Q1) is represented by the following formula (3):

$$V_{gs1} = \sqrt{\frac{I_{const} + I_{var}}{K1}} + V_{th} \tag{3}$$

here, K1: gain coefficient of the source follower enhancement type FET 1(Q1).

The current $I_{var}$ flowing through the current adjusting enhancement type FET 4(Q2) is represented by the following formula (4):

$$I_{var} = K2(V_{gs2} - V_{th})^2 \tag{4}$$

here, K2: gain coefficient of the current adjusting enhancement type FET 4(Q2)

$V_{gs2}$: a voltage between the gate and source of the current adjusting enhancement type FET 4(Q2)

Since the source follower enhancement type FET 1(Q1) and the current adjusting enhancement type FET 4(Q2) are arranged on the same wafer quite close to each other, the differences in the threshold voltages of the transistors are smaller than several tens of mV. Accordingly, in a case where the junction depth of the implantation region of the FET is shallower than a predetermined depth and the threshold voltage of FET on a wafer is deviated by $+\Delta V_{th}$ from the design value $V_{th}$, the level shift $V_{gs1}$ at the source follower FET 1(Q1) also rises by $\Delta V_{th}$ while the current $I_{var}$ flowing through the current adjusting enhancement type FET 4(Q2) which is determined by the following formula (5):

$$\Delta(I_{var})^{1/2} = -(K2)^{1/2} \cdot \Delta V_{th} \tag{5}$$

is reduced. Therefore, the rising of the amount of the level shift $V_{gs1}$ at the source follower FET 1(Q1) is suppressed by the reduction in current $I_{var}$ flowing through the current adjusting FET 4(Q2), whereby the variation in the amount of the level shift of the entire circuit is suppressed.

On the other hand, in a case where the junction depth of the implantation region of the FET is deeper than a predetermined depth and the threshold voltage of the FET on a wafer is deviated from the design value $V_{th}$ by $-\Delta V_{th}$, the level shift $V_{gs1}$ at the source follower FET 1(Q1) is reduced by $-\Delta_{Vth}$. In this case, since the current $I_{var}$ flowing through the current adjusting FET 4(Q2) increases, the reduction in the level shift amount $V_{gs1}$ at the source follower FET 1(Q1) is suppressed by the increase in the current $I_{var}$ flowing through the current adjusting FET 4(Q2), and the variation in the amount of the level shift of the entire circuit are suppressed.

In addition, the level shift circuit of the present invention can suppress the variations in the gain coefficient. Suppose that the gain coefficient K1 of the source follower FET 1(Q1) varies in the direction of increases so that the gate-to-source voltage of the source follower FET 1(Q1) is reduced. At the same time, the current $I_{var}$ increases because the gain coefficient K2 of the current adjusting FET 4(Q2) has increased, and it functions to increase gate-to-source voltage of the source follower FET 1(Q1), thereby suppressing the variations in the level shift of the entire circuit. Also in a case where the gain coefficient K1 of the source follower FET 1(Q1) is reduced variations in the level shift of the entire circuit are suppressed.

In the level shift circuit of this first embodiment, a current adjusting enhancement type FET 4(Q2), between the gate and the source of which a resistor 5 for biasing is inserted, is connected in parallel with the constant current source 3 so that a current from the constant current source 3 flows through the resistor 5. Therefore, even when the threshold voltage and the gain coefficient of the source follower enhancement type FET 1(Q1) increase or are reduced relative to the design values, the threshold voltage and the gain coefficient of the current adjusting enhancement type FET 4(Q2) also increase or are reduced by the same amount and variations in the level shift $V_{gs1}$ between the gate and source of the source follower FET 1(Q1) are suppressed by the variations in the current $I_{var}$ flowing through the current adjusting FET 4(Q2), thereby suppressing variations in the amount of the level shift of the entire circuit.

EMBODIMENT 2

Figure 2:
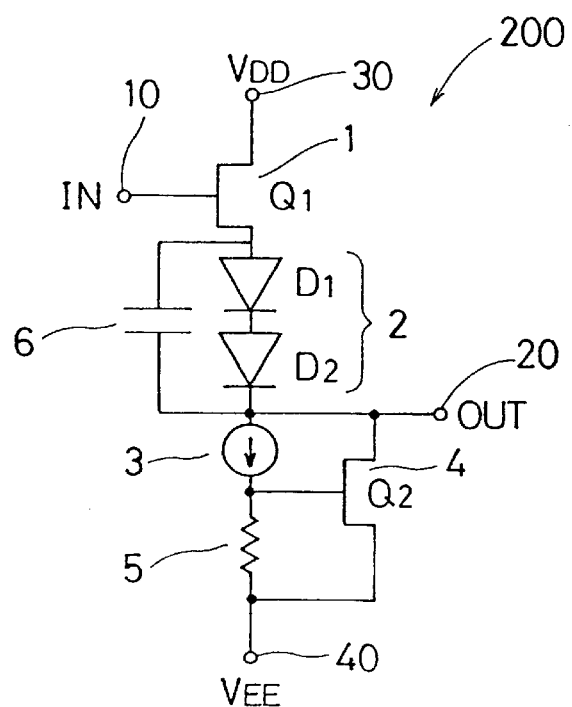
FIG. 2 is a diagram illustrating a circuit construction of a level shift circuit according to a second embodiment of the present invention.

FIG. 2 is a diagram showing a circuit construction of a level shift circuit according to a second embodiment of the present invention. In FIG. 2, the same reference numerals designate the same or corresponding elements as those shown in FIG. 1. In a level shift circuit 200 of this second embodiment, a capacitance 6 for passing a high frequency signal is connected in parallel to the level shift diode 2 of the level shift circuit 100 of the first embodiment shown in FIG. 1.

In the level shift circuit of this second embodiment, in addition to the same effects as in the level shift circuit of the first embodiment, the dc level of the input signal is level-shifted via the source follower enhancement type FET 1(Q1) and the level shift diode 2. A high frequency signal is output to the output terminal 2 through the capacitance 6, thereby preventing waveform deterioration of the high frequency signal due to the input capacitance of the source follower enhancement type FET 1(Q1) and the internal resistance of the level shift diode 2, resulting in transmission of a high speed signal.

EMBODIMENT 3

Figure 3:
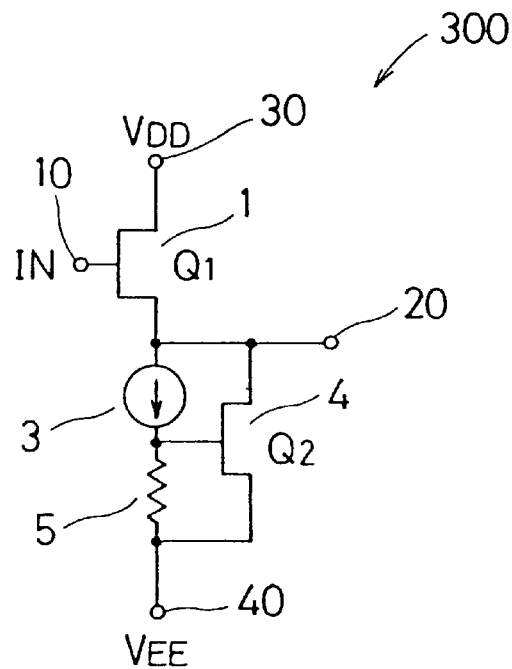
FIG. 3 is a diagram illustrating a circuit construction of a level shift circuit according to a third embodiment of the present invention.

FIG. 3 is a diagram showing a circuit construction of a level shift circuit of a third embodiment of the present invention. In the figure, the same reference numerals designate the same or corresponding elements as those in FIG. 1. In the level shift circuit 300 of this third embodiment, the level shift diode 2 is removed from the level shift circuit 100 of the first embodiment shown in FIG. 1, and the source of the source follower FET 1(Q1) is directly connected to the output terminal 20, and the drain of the current adjusting FET 4(Q2) is connected to the source of the source follower FET 1(Q1).

In the level shift circuit of this third embodiment, the amount of the level shift comprises only the gate-to-source voltage of the source-follower FET 1(Q1). Accordingly, the level shift circuit of this embodiment can be used as a buffer circuit having a level shift of less than 0.7 V. EMBODIMENT 4

Figure 4:
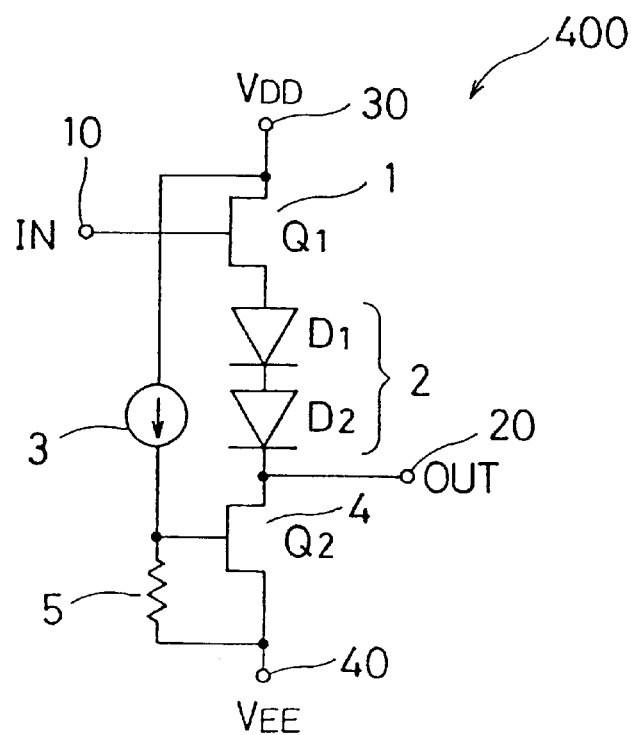
FIG. 4 is a diagram illustrating a circuit construction of a level shift circuit according to a fourth embodiment of the present invention.
Figure 6:
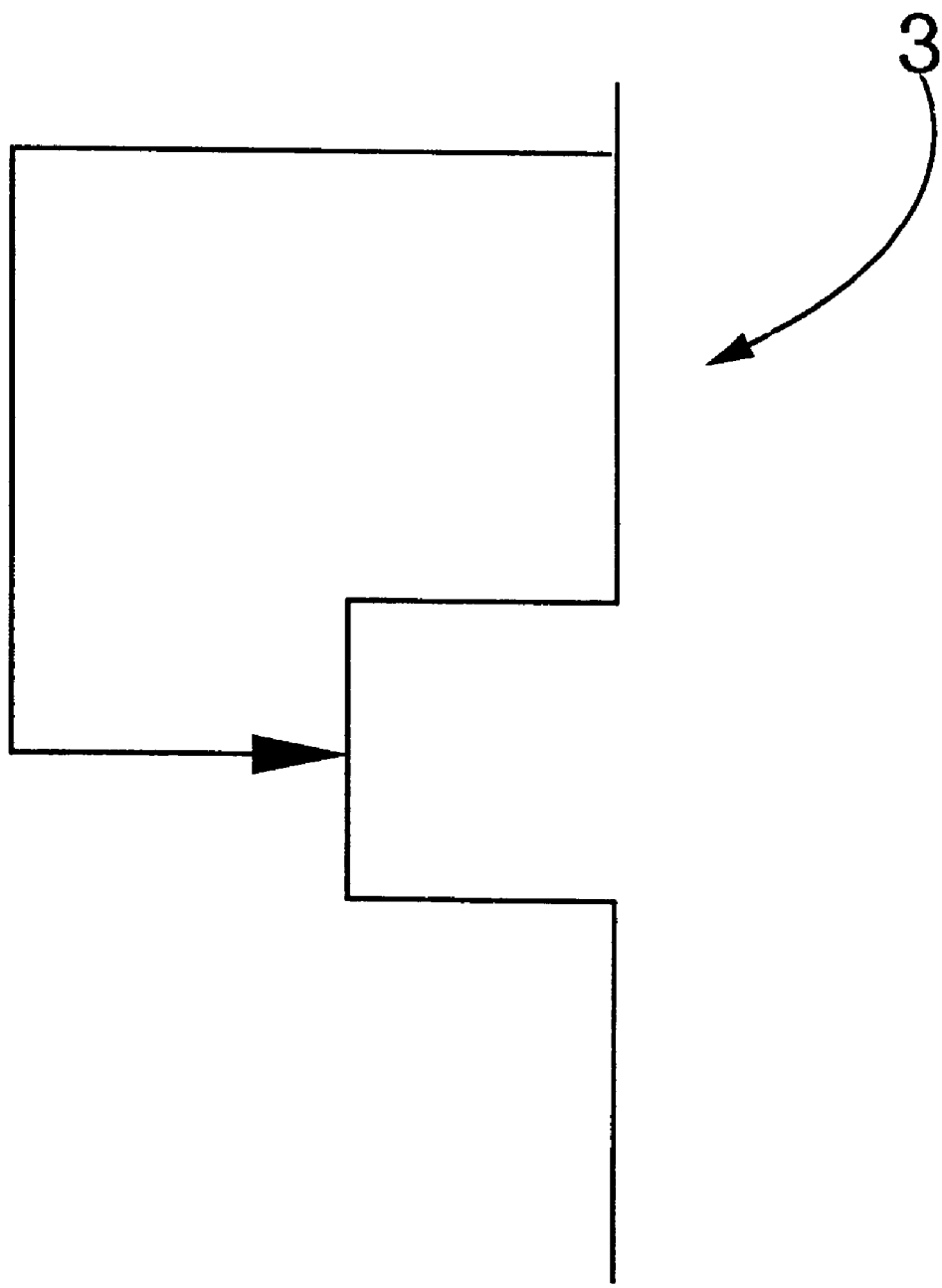
FIG. 6 is a diagram illustrating a circuit construction of a constant current source used in the level shift circuit according to the fourth embodiment of the present invention.

FIG. 4 is a diagram showing a circuit construction of a level shift circuit according to a fourth embodiment of the present invention. In FIG. 4, the same reference numerals designate the same or corresponding elements as those in FIG. 1. Reference numeral 400 designates a level shift circuit of this fourth embodiment. In the level shift circuit of this fourth embodiment, a gate of a source follower enhancement type field effect transistor 1 is connected to the input terminal 10, a drain thereof is connected to the positive power supply 30, a source thereof is connected to the anode of the level shift diode 2. The cathode of the level shift diode 2 is connected to the drain of the current adjusting enhancement type FET 4(Q2). An output terminal 20 is connected to this connection node. A constant current source 3 is connected between the positive power supply and the gate of the current adjusting enhancement type FET 4(Q2). FIG. 6 is a circuit diagram of the constant current source 3 of FIG. 4. A resistance 5 for biasing is connected between the gate and source of the current adjusting FET 4(Q2).

In the level shift circuit 100 of the above-described first embodiment, the constant current source 3 contributes to the dissipation current of the entire level shift circuit and also provides a bias between the gate and source of the current adjusting enhancement type FET 4(Q2). On the other hand, in the level shift circuit 400 of this fourth embodiment, the constant current source 3 functions only to provide a bias for the current adjusting FET 4(Q2) and the current of the entire level shift circuit is provided by the drain current of the current adjusting FET 4(Q2).

In the level shift circuit 400 of this fourth embodiment, since the constant current source 3 functions only to provide a bias for the current adjusting FET 4(Q2), the bias can be set to various values without considering the current of the entire circuit. This enables varying the size of the resistor inserted between the gate and source of the current adjusting FET 4(Q2), and enables miniaturization of a level shift circuit.

As discussed above, in a level shift circuit according to the present invention, a current adjusting enhancement type FET is connected in parallel with a constant current source, and therefore, even when the threshold value and gain coefficient of the source follower enhancement type FET vary largely in the manufacture, similar variations arise in the current adjusting FET produced in the vicinity of the source follower FET, and the variations in the current flowing through the source follower FET are suppressed. As a result, a desired constant output voltage is always obtained.

In addition, in a level shift circuit according to the present invention, a capacitance is connected in parallel with the level shift diode connected to the source of the source follower FET, and therefore, the input high frequency signal is output without receiving waveform deterioration due to the input capacitance of the source follower FET and the internal resistance of the level shift diode, thereby enabling the transmission of a high speed signal.

Further, a level shift circuit according to the present invention has a construction in which a current by a constant current source provides a bias for a current adjusting enhancement type FET, and a current of the entire level shift circuit is provided by a drain current of the current adjusting FET. Therefore, the size of a resistor inserted between the gate and source of the current adjusting FET can be arbitrarily set, thereby enabling miniaturizing the circuit.

What is claimed is:

1. A level shift circuit which drops an output voltage of a prior stage circuit to an input voltage level required at a next stage circuit comprising:

a level shift diode having an anode and a cathode;

a source follower enhancement-type field effect transistor having a gate connected as an input terminal of the circuit, a drain connected to a positive terminal of a power supply, and a source connected to the anode of the level shift diode;

a current adjusting enhancement-type field effect transistor having a drain connected to the cathode of the level shift diode as an output terminal of the circuit, a gate connected to the positive terminal of the power supply through a constant current source, and a source connected to a negative terminal of the power supply, the constant current source including a depletion-type field effect transistor having a gate, a drain, and a source, the gate and source being connected to each other; and a resistor connected between the gate and the source of the current adjustment enhancement-type field effect transistor whereby a gate-to-source voltage of the current adjusting enhancement-type field effect transistor is controlled by a current flowing through the resistor to adjust a current flowing through the source follower enhancement-type field effect transistor.

* * * * *